United States Patent [19]

Lipp

[11] Patent Number: 4,682,201
[45] Date of Patent: Jul. 21, 1987

[54] GATE ARRAY CELL

[75] Inventor: Robert Lipp, Los Gatos, Calif.

[73] Assignee: California Devices, Inc., San Jose, Calif.

[21] Appl. No.: 883,474

[22] Filed: Jul. 14, 1986

Related U.S. Application Data

[63] Continuation of Ser. No. 662,614, Oct. 19, 1984, abandoned.

[51] Int. Cl.$^4$ ............................................. H01L 27/02
[52] U.S. Cl. ........................................ 357/42; 357/45; 29/591
[58] Field of Search ...................... 29/591; 357/42, 45, 357/46, 68; 365/72, 181

[56] References Cited

U.S. PATENT DOCUMENTS 4,319,342  3/1982  Scheuerlein ..................... 357/45 X

FOREIGN PATENT DOCUMENTS 0064046  4/1983  Japan ..................................... 357/42

OTHER PUBLICATIONS

"Channel-Less Gate Array Reduces Die Size" Electronic Engineering, Jun. 1983, p. 113.

Primary Examiner—Martin H. Edlow
Assistant Examiner—Sara W. Crane
Attorney, Agent, or Firm—Flehr, Hohbach, Test, Albritton & Herbert

[57] ABSTRACT

A gate array layout in which alternative rows include areas of devices of the same diffusion type, and all the rows run in parallel on the device. However, the diffusion areas in adjacent rows are offset with respect to one another so that only cells in alternative rows which are all of one conductivity define straight parallel columns. By providing this relative offset between adjacent rows, the contacts to the source, drain and gate of interconnected devices all lie on straight lines, thereby simplifying the metal interconnect patterns. In addition to cells along each row being immediately abutting, cells in adjacent rows are abutting (although offset with respect to each other) so that no routing channels need be reserved. By offset, it is meant that the cells of both N and P type conductivity devices each contain the same number of transistor, or source and drain diffusions lying along a given row; but at least one of the source and drain diffusions in each cell does not lie in a column with the adjacent diffusion.

5 Claims, 5 Drawing Figures

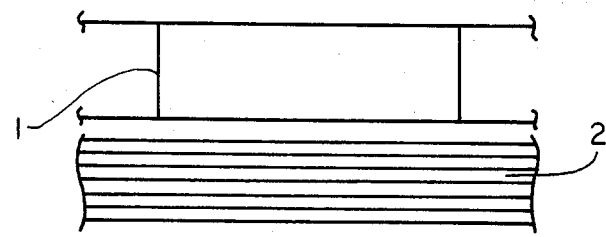
FIG_1
PRIOR ART
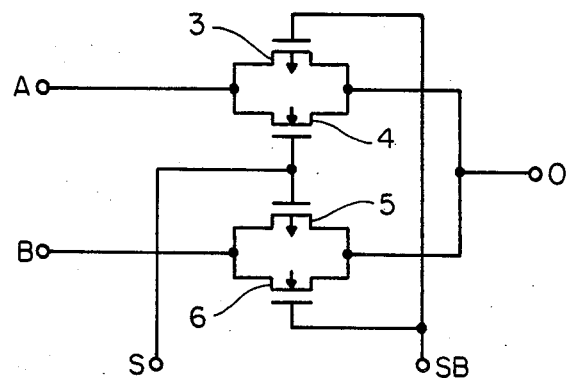
FIG_2
PRIOR ART
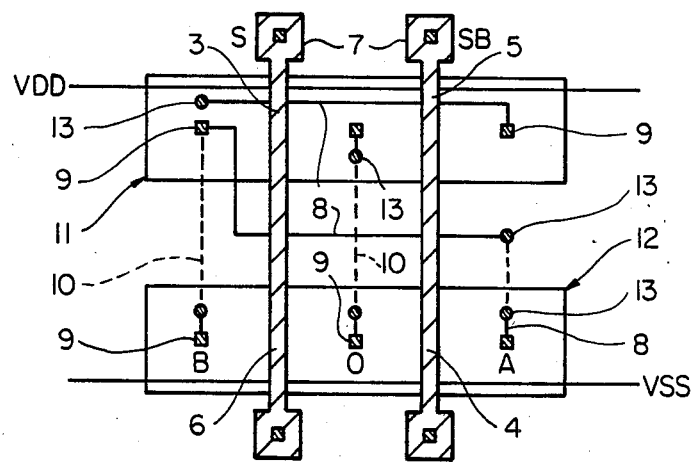
FIG_3 PRIOR ART

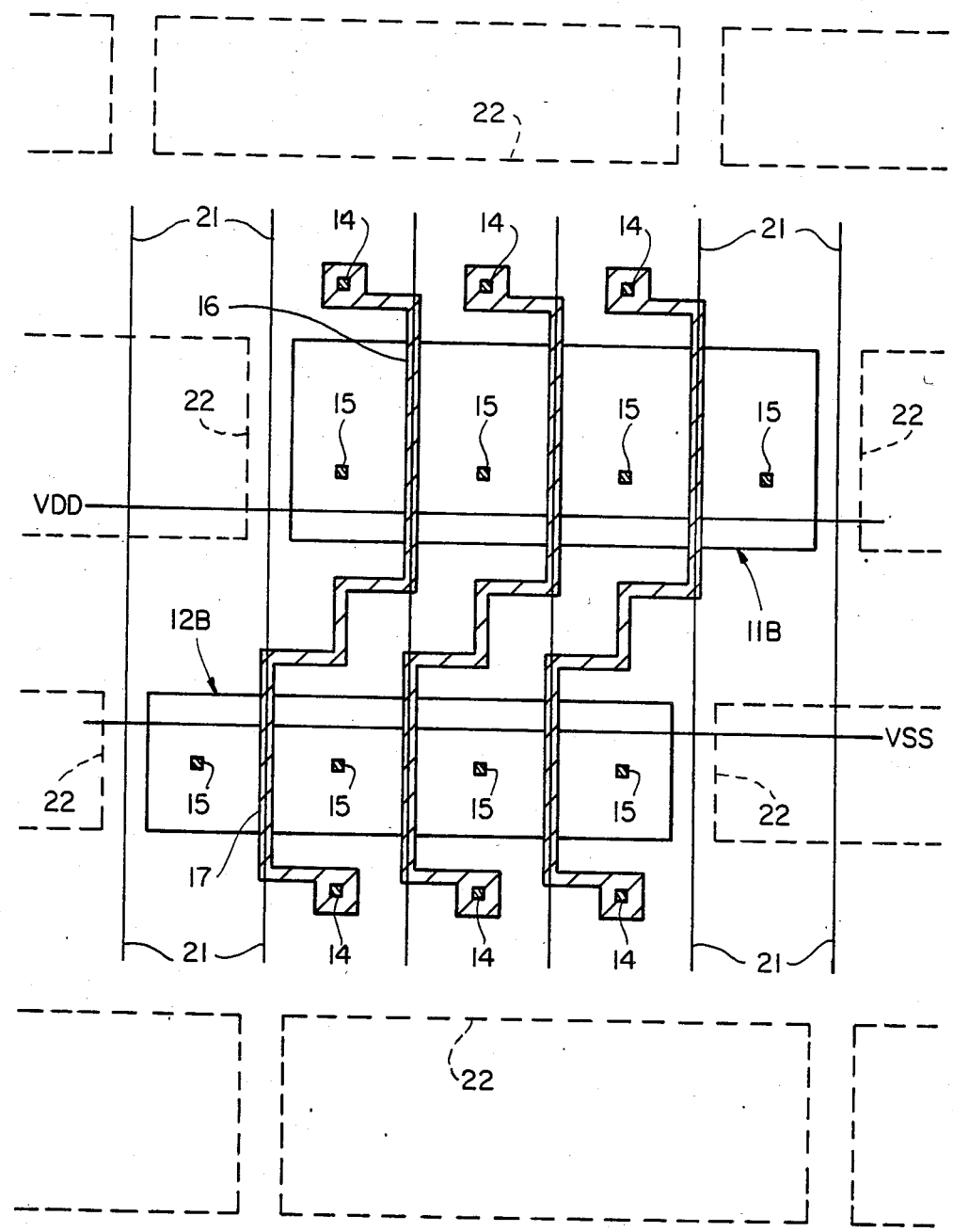
FIG_4

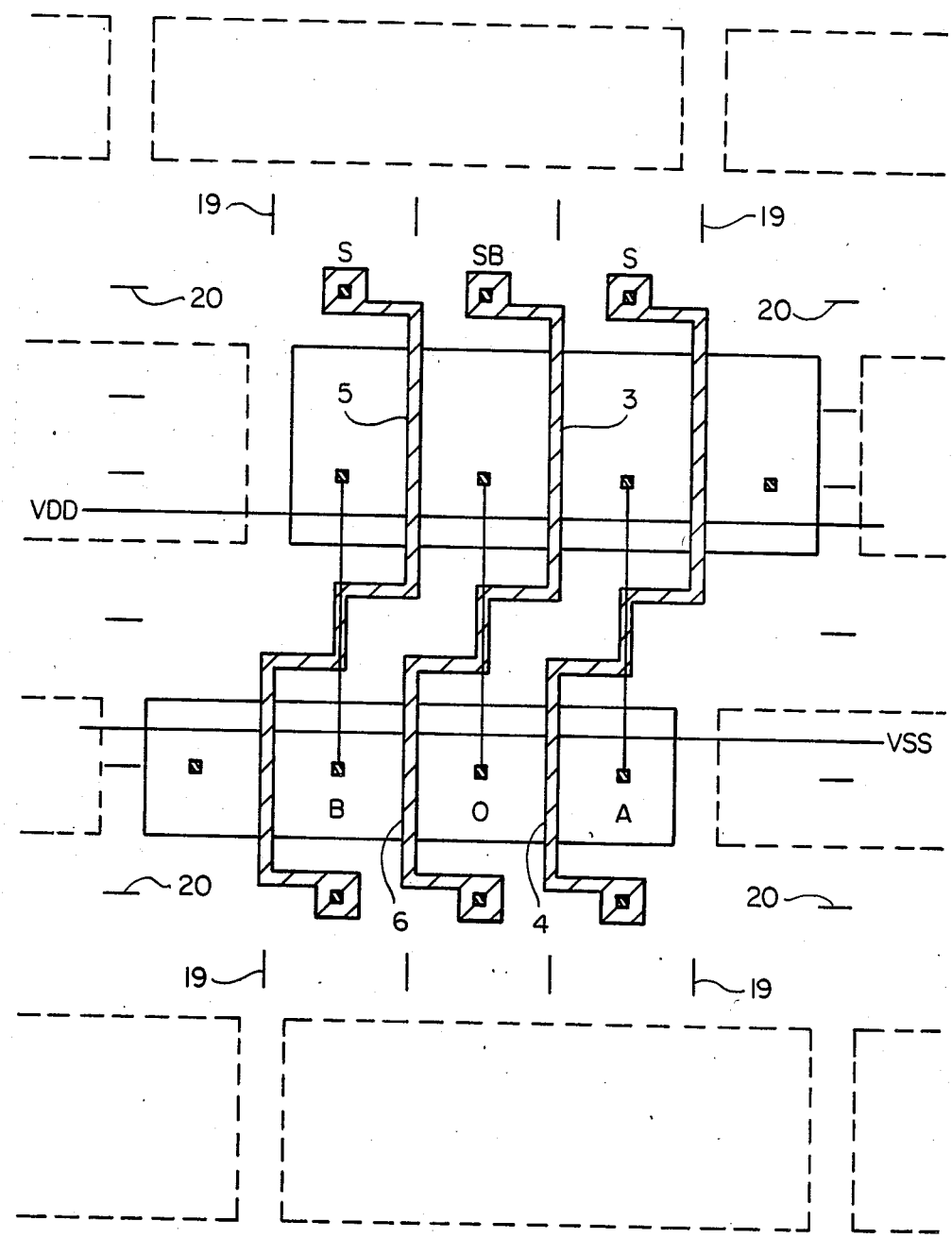
FIG_5

GATE ARRAY CELL

This is a continuation of application Ser. No. 662,614, filed Oct. 19, 1984, now abandoned.

A major concern in the design of large CMOS gate array is the allowance of sufficient routing space within each cell and between the cells, so that automatic routing can be utilized to make all the necessary connections. Increase in the amount of routing space, typically by providing a significant interconnect area adjacent to each distinct cell as shown in FIG. 1, increases the probability of achieving all the necessary routing connections. However, this is achieved at a cost of decreasing the number of usable die per wafer, increasing the cost of the gate array. Further, long routing connections also impose a speed penalty on the finished design.

Therefore, it is an objective of the present invention to provide an improved design.

More particularly, it is an objective of the present invention to reduce or eliminate the reserved interconnect space between adjacent cells in a gate array.

Another objective is to reduce excess wiring which has been needed to connect the transistors of different cells.

A related objective of the present invention is to provide straight interconnect paths between cells on the metal connection layers.

FIG. 1 illustrates what is present by the common method of implementing gate arrays. A distinct cell area 1 is set aside for transistor components and their immediate connections. A cell comprises the repetitive blocks of elements which make up the gate array prior to specific layers of metal connections being laid down to implement a desired circuit pattern. A second area 2 is reserved for wiring interconnecting the repetitive groups of components for cells. The cell area 1 is a dedicated area which must be bypassed (or crossed if more than one level of metal interconnection is available) and therefore increases circuit size by blocking rather aiding interconnections. An example of this interconnection technique is found in the article by N. Matsumura, "Introduction of an Ultrafast 8000 Gate CMOS Gate Array", proceedings of the Second International Conference on Semi-custom, London, 1982.

FIG. 2 is a schematic of a common CMOS logic element, i.e., a transmission gate pair, a logic element which commonly occurs in gate array devices. A review of the Matsumura article illustrates the complexity of wiring such an element using techniques common in the prior art. An example of such a layout is symbolically illustrated in the plan view of FIG. 3.

The reference numerals and letters are common in both FIGS. 2 and 3; to the extent that the elements are repeated in the illustrations of the invention which comprise FIGS. 4 and 5, common reference numerals and numbers are repeated. In FIGS. 2 and 3, A and B are inputs to the transmission gates G1, G2, each of which comprise a pair of complementary CMOS transistors. The outputs of the transmission gates G1, G2 are coupled to the element output O. The lines S and SB are control inputs which determine whether input signal A or input signal B is connected to the output O. These signals, S and SB, drive the gates of the complementary transistors of transmission gates G1, G2.

The physical layout of this logic element is shown in FIG. 3, the P-channel transistors 3, 5 are provided by the P-channel diffusions, Area 11; the N-channel transistors 4, 6 are provided by the N-type diffusions, Area 12. The gate layers of each of these devices are provided by the polysilicon lines 7. The interconnects between the complementary devices to complete the circuit are provided by two layers of metal. The first metal layer 8 contacts the devices at contacts 9; the second layer of metal inerconnect 10 is connected to the diffusion layers of the cell by vias 13 to first layer metal 8. Power to drive the transistors of the cell is provided by the lines labeled $V_{DD}$ and $V_{SS}$ which comprise the power and ground bus lines. As such, they must pass through all cells. Further, these power and ground bus lines are required to be on the first or bottom layer of metal, as the vertical interconnects over the cells must be on the top layer of metal.

Inspection of FIG. 3 further demonstrates that the cell area is almost entirely blocked by intra-cell connections. Therefore, further interconnections in a gate array comprising cells as laid out in FIG. 3 is achieved only by enlarging the cells, or by adding interconnect channels 2 (as shown in FIG. 1) on the first layer interconnect level.

It is an objective of this invention to provide a cell design which allows the extra interconnect levels to pass through the cell without increasing the cell area in typical logic element implementations.

It is further and related objective to eliminate the separate routing channels provided in the gate arrays of the prior art.

These and other objectives and advantages of the present invention are achieved by the gate array layout of the present invention in which alternative rows include areas of devices of the same diffusion type, and all of the rows run in parallel on the device. However, the diffusion areas in adjacent rows are offset with respect to one another so that only cells in alternative rows which are all of one conductivity define straight parallel columns. By providing this relative offset between adjacent rows, the contacts to the source, drain and gate of interconnected devices all lie on straight lines, thereby simplifying the metal interconnect patterns. In addition to cells along each row being immediately abutting, cells in adjacent rows are abutting (although offset with respect to each other) so that no routing channels need be reserved. By offset, it is meant that the cells of both N and P type conductivity devices each contain the same number of transistors, or source and drain diffusions lying along a given row; but at least one of the source and drain diffusions in each cell does not lie in a column with the adjacent diffusion.

The terms rows and columns have been adopted for convenience to more easily explain the invention with respect to the diagrams of FIGS. 4 and 5, the term row indicating the cells running horizontally across the page, and the term column referring to the cells vertically up the page. Obviously the terms could be interchangeable by rotating the axis of reference 90 degrees.

The invention and its features and advantages will be more clearly understood with reference to the following figures in which FIG. 1 shows the prior art gate array layouts:

FIG. 2 shows an electrical schematic of a typical gate array logic element;

FIG. 3 is a plan view of a typical implementation in a gate array cell or cells the circuit logic element of FIG. 2;

FIG. 4 illustrates the layout of the gate array cell design of the present invention; and FIG. 5 illustrates the metal interconnects used to implement the circuit of FIG. 2 in the gate array of the present invention.

Referring to FIG. 4, this particular design of the gate array provides the diffusion areas 11B, 12B, each of which together provides three pairs of CMOS transistors. The contacts 14 to the polysilicon layers 16 which define the transistor gates are arranged to be in a straight line above and below the transistor source-drain contact 15. The polysilicon lines 3, 5 which are to follow a regular pattern between all pairs of cooperative cells are laid down as meandered lines. By "meandered lines" is meant that the polysilicon lines 3 pass to the right of one source/drain contact 15 of a pair and to the left of the other source/drain contact 15 of a pair. By providing the source/drain contacts 15 in a straight line, vertical lines 21 pass directly between horizontally adjacent contacts. Thus, metal lines 19, 10 21 can pass through cells having source-drain diffusions of one conductivity type, but between adjacent cells of the opposite conductivity type.

The offset of the P type transistors 16 and the N-type transistors 17 allows straight line connections between transistor contacts in forming logic elements. Cells in the same row, which are identical, can be closely abutted. Cells in columns which are adjacent but of opposite conductivity are also closely abutted, but include at least one offset device. Thus a complete array of cells without reserve interconnection channels can be formed with this invention.

In most applications, the amount of interconnection provided by this invention is sufficient. For some applications, additional interconnects may be required. In such a case, to provide space for such additional interconnects, adjacent abutting cells can be sacrificed and efficiently used to give space for such interconnects. This gives the additional benefit of efficiently integrating both high and low density circuits without compromise, as the gate array of the present invention is self-adapting to both.

Other features and advantages of the present invention may become apparent to a person of skill and art who studies the subject invention disclosure. Therefore, the present invention is to be limited only by the following claims.

What is claimed:

1. A gate array device comprising a two-dimensional array of cells forming horizontal rows and vertical columns wherein vertically adjacent rows of cells are abutting, so that no routing channels adjacent the rows are reserved, cells in alternate rows comprising a plurality of identical and abutting N-channel devices having horizontally aligned source /drain contacts, cells of rows intermediate each of said rows of N-channel device cells comprising a plurality of identical and abutting P-channel deices, successive vertical cells of one conductivity type defining columns offset from columns defined by cells of the intermediate rows of opposite conductivity type, wherein all but one of the source/drain contacts in each said N-type cell are vertically aligned in columns with the source/drain contacts of one of said P-type cells to define a plurality of pairs of vertically aligned complementary devices, and source/drain contacts of said plurality of pairs of complementary devices in vertically abutting cells lying on straight vertical lines parallel to the columns and a plurality of polysilicon lines comprising the gates of each said pair of vertically aligned complementary devices, all of said polysilicon lines following meandered patterns between horizontally adjacent source/drain contacts while connecting the gate contacts of said vertically abutting cells, connections between circuits formed on said gate array device comprising first and second layers of metal lines running parallel to the rows and columns of cells whereby said interconnects pass through the cells without an increase in size in cell area.

2. A gate array device as in claim 1 wherein said source/drain contacts of each said pair of complementary devices connected by said meandered patterned polysilicon lines lie on a straight vertical columnar line, said gate contacts to each device of said pair of complementary devices lying on said same, straight vertical line.

3. A method of manufacturing a gate array device wherein vertically adjacent rows of cells are abutting, so that no routing channels adjacent the rows are reserved, comprising a two-dimensional array of abutting cells forming rows and columns, comprising the steps of forming rows of identical adjacent cells along one dimension, alternate rows comprising cells of N-channel devices, rows intermediate each of said alternate N-channel cell rows comprising cells of P-channel devices, locating cells of alternate rows of N-type devices to define vertical columns offset from the columns defined by cells of P-type devices vertically aligning all but one source/drain contact of devices in an N-type cell with source/drain contacts of complementary devices in a vertically abutting P-type cell to form vertically associated pairs of complementary devices, locating gate contacts to each said device of said complementary pair of vertically associated pairs of complementary devices, locating gate contacts to each said device of said complementary pair of vertically associated N-type and P-type devices to be vertically aligned therewith, forming polysilicon lines defining gates of said vertically associated pairs of complementary transistors following meandered patterns between every said complementary device pair of said vertically abutting cells, and forming connections between the devices comprising first and second layers of metal lines running parallel to the rows and columns of cells, said interconnects passing through the cells without an increase in the size of the cell area.

4. A method of manufacturing a gate array device as in claim 3 including the step of sacrificing intermediate cells along rows of identical devices to allow space to form interconnections between identical cells, no dedicated interconnect space being reserved adjacent said vertically abutting cells.

5. A device as in claim 1 wherein said meandered polysilicon line passes to the right of one source/drain contact of a pair of complementary devices, and to the left of the source drain contact of the other device of said pair of complementary devices.

* * * * *